United States Patent
Jin

(10) Patent No.: US 9,859,860 B1
(45) Date of Patent: Jan. 2, 2018

(54) COMPRESSOR SYSTEM WITH EQ

(71) Applicant: Premium Loudspeakers (Hui Zhou) Co., Ltd., Huizhou (CN)

(72) Inventor: Xiang Feng Jin, Huizhou (CN)

(73) Assignee: PREMIUM LOUDSPEAKERS (HUI ZHOU) CO., LTD., Huizhou, Guangdong Province (CN)

( * ) Notice: Subject to any disclaimer, the term of this patent is extended or adjusted under 35 U.S.C. 154(b) by 0 days.

(21) Appl. No.: 15/354,702

(22) Filed: Nov. 17, 2016

(30) Foreign Application Priority Data

Jul. 25, 2016 (CN) ...................... 2016 2 0781340 U

(51) Int. Cl.
*H03G 9/20* (2006.01)
*H04R 3/04* (2006.01)

(52) U.S. Cl.
CPC ................. *H03G 9/20* (2013.01); *H04R 3/04* (2013.01); *H04R 2430/01* (2013.01)

(58) Field of Classification Search
CPC .............................. H04R 3/04; H04R 2430/01
See application file for complete search history.

(56) References Cited

U.S. PATENT DOCUMENTS

| | | | | |
|---|---|---|---|---|
| 5,276,739 A * | 1/1994 | Krokstad | ............. | H04R 25/453 381/318 |
| 2010/0086149 A1* | 4/2010 | Kuroda | .................. | H03G 7/002 381/103 |
| 2012/0016505 A1* | 1/2012 | Gough | ............. | G11B 20/10527 700/94 |
| 2014/0376748 A1* | 12/2014 | Okabayashi | ......... | H03G 3/3005 381/120 |

* cited by examiner

*Primary Examiner* — Brenda Bernardi
(74) *Attorney, Agent, or Firm* — Cantor Colburn LLP

(57) ABSTRACT

The utility model provides a compressor system with an equalizer (EQ). The compressor system includes a signal input device in signal communication with the EQ and a compressor. The compressor system further includes a signal output device in signal communication with the compressor. The compressor includes a signal detection module. In the system, an electrical level threshold of a full-band audio signal is setup in the compressor, and the value of electrical level of the input signal is detected by the signal detection module. After comparison of electrical level threshold and the value of electrical level, the system determines whether the compressor is activated or deactivated. The system can achieve the technology effect of effectively compressing and limiting the audio signal of a different frequency.

4 Claims, 2 Drawing Sheets

COMPRESSOR SYSTEM WITH EQ

CROSS REFERENCE TO RELATED APPLICATION

This application is related to and claims the benefit of Chinese Patent Application Number CN2016207813407 filed on 25 Jul. 2016, the contents of which are herein incorporated by reference in their entirety.

FIELD OF THE INVENTION

The invention generally relates to technology field of equipment and system for audio signal processing, especially relates to a compressor system with EQ.

BACKGROUND OF THE INVENTION

With the development of entertainment and media industry, consumers become more sensitive to the quality of sound quality. In various venues such as, theater, concert and home theater and other application occasion of audio player equipment, requirement for audio adjust function of audio processing system is getting higher and higher.

In the technosphere of audio mixer technology, equalizers and compressors have been widely used in the process of audio signal. With the combined application of an equalizer and compressor, modulation distortion of D-class power amplifier can be controlled during the maximum power output, and maximum output can also be adjusted. In the application of digital signal processing (DSP), the compressor is series connected to the equalizer, the input signal is input to the equalizer for processing then delivered to compressor for compressing and limiting, and received by the signal output device. Generally, only one threshold is setup in the compressor during the application above, and the threshold is a constant value for full-brand audio signal. However, as the voltage output corresponding to each frequency is different, it leads to the result that the trigger threshold for volume is different. Bandwidth of triggered compressor becomes larger and larger with the volume of each frequency is increasing. When the volumes of each frequency are larger than the threshold, the shape of the output signal becomes flat, and cannot reach the effect of audio adjustment.

DETAILED DESCRIPTION OF THE INVENTION

Various non-limiting embodiments provide a compressor system with an equalizer (EQ). In the system, electrical level threshold of a full-band audio signal is setup in the compressor, and the value of electrical level of the input signal is detected by the signal detection module. After comparison of an electrical level threshold and the value of the electrical level, the system determines whether the compressor is triggered to operate (i.e., activated to process and limit the input signal) or not operate (i.e., deactivated such that the input signal is not limited). The system can achieve the technology efficacy that audio signal of different frequency is compressed and limited effectively.

To achieve the effect mentioned above, the at least one embodiment provides a compressor system with EQ, which comprises a signal input device 1, an equalizer 2, a compressor 3, and a signal output device 4. The compressor 3 further includes a signal detection module 31. The system can perform audio signal processing of the compressor system with EQ as described below.

The signal input device 1 sends out input signal (a) and input signal (b) to the compressor parallelly at the same time. In at least one embodiment input signal (a) is identical to signal (b), and input signal (a) is input to the compressor 3 directly; while input signal (b) is regulated by the equalizer 2 then input to the compressor 3 in the form of input signal (b1), then detected by the signal detection module 31.

In the system, the electrical level threshold of the full-band audio signal is setup in the compressor 3. The value of the electrical level of the input signal (b1) is compared to the electrical level threshold of corresponding frequency. If the value of electrical level of the input signal (b1) is greater than or equal to electrical level threshold, the compressor 3 is triggered (i.e., activated) to process the input signal (a), i.e., to compress and limit the input signal (a). Accordingly the input signal (a) is processed by the compressor 3 to generate output signal (a1), which is output to the signal output device 4.

If, however, the value of the electrical level of the input signal (b1) is less than the electrical level threshold, the compressor 3 is not triggered (i.e., deactivated) to operate, i.e., the input signal is not processed. Accordingly, the non-processed (i.e., non-compressed or non-limited) input signal (a) is output to the signal output device 4 in the form of output signal (a).

In at least one embodiment, the range of the full-band audio signal is about 20 Hz to about 20 kHz. To cover the processing range from about 20 Hz to about 20 kHz, an audio signal of different frequency would be compressed and limited by the system effectively.

The signal input device 1 includes at least one of a mobile phone, a compact disc (CD) player, a digital video disc (DVD) player, a recorder, or a mobile media device so as to meet the requirement of audio input signal processing in different applications. And the signal output device 4 includes at least one of a sound-box, a loudspeaker or a headset. After being processed by the compressor system with EQ, the audio signal is received by the signal output device 4 with high fidelity.

Based on the technical solutions mentioned above, the advantages of the utility model are as below:

(1) In the compressor system with EQ according to at least one embodiment, the electrical level threshold of each frequency in full-band audio signal is setup in the compressor 3, and the value of the electrical level of the input signal is detected by the signal detection module 31. After comparison of electrical level threshold and the value of electrical level, the system determines whether or not to trigger the compressor 3. In this manner, the audio signal of different frequency may be compressed and limited effectively.

(2) The compressor system with EQ provided by the utility model can be applied to most of audio equipment which includes, but is not limit to, an audio mixer system, home theater, cinema, public address system and other audio application system. And after being processed by the compressor system, the audio signal is received by the signal output device 4 with the characteristic of high fidelity and controllability. On account of the features, it meets the requirement of audio signal adjustment and achieves a wide range of application in audio signal processing.

DETAILED DESCRIPTION

In order to fully comprehend the features and efficacy of the present utility model, a detailed description is described by the following substantial embodiments in conjunction with the accompanying drawings. The description is as below.

Figure 1:
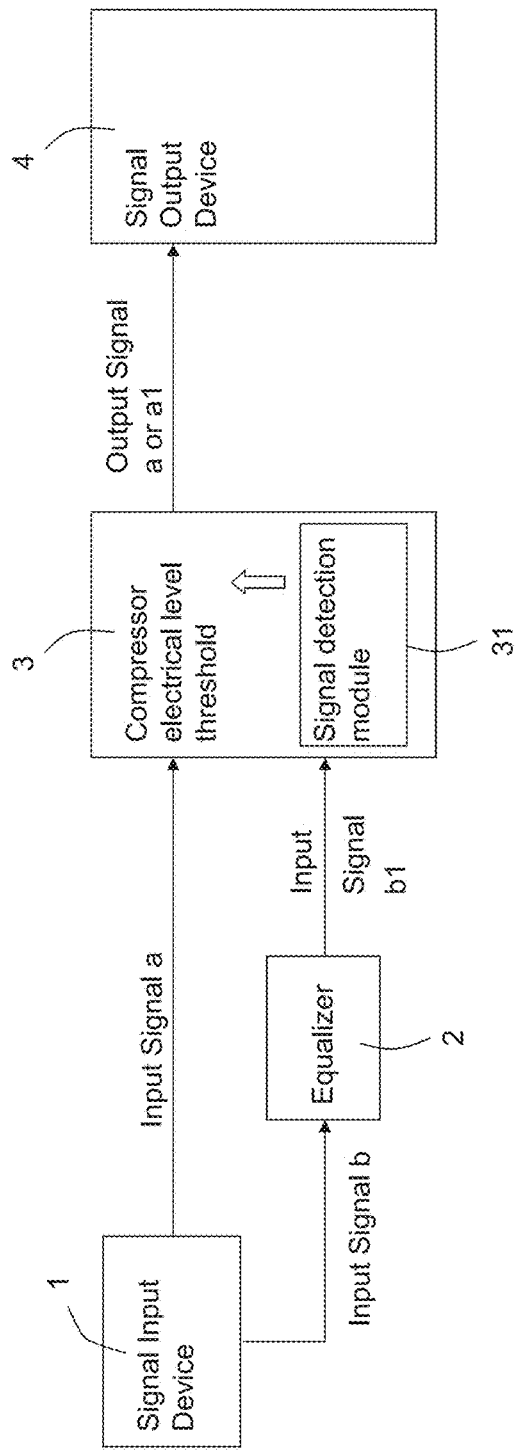
FIG. 1 is a principle diagram of a compressor system with EQ in accordance with an embodiment of the utility model.

Referring to FIG. 1, a compressor system with EQ is illustrated in accordance with a non-limiting embodiment. The compressor system with EQ comprises a signal input device 1, an equalizer 2, a compressor 3, and a signal output device 4. The compressor 3 includes a signal detection module 31.

The signal input device 1, such as CD, DVD, or other type of mobile media device, sends out two-way input signal to compressor 3 parallelly, that is input signal (a) and input signal (b). Signal (a) is identical to input signal (b). For example, in the frequency of approximately 180 Hz, both of the electric levels of input signal (a) and input signal (b) are 5 dB. However, input signal (a) is input to the compressor 3 directly, while input signal (b) is adjusted with signal gain by the equalizer 2 then input to the compressor 3 in the form of input signal (b1), and detected by the signal detection module 31. The function of equalizer 2 is to adjust the value of signal gain or attenuation of every frequency. In this embodiment, for example, the value of electric level of input signal (b) is 5 dB, and after attenuation processing (−5 dB) adjusted by equalizer 2, the value of electric level of input signal (b1) is only 0 dB. Then input signal (b1) is input to compressor 3.

Figure 2:
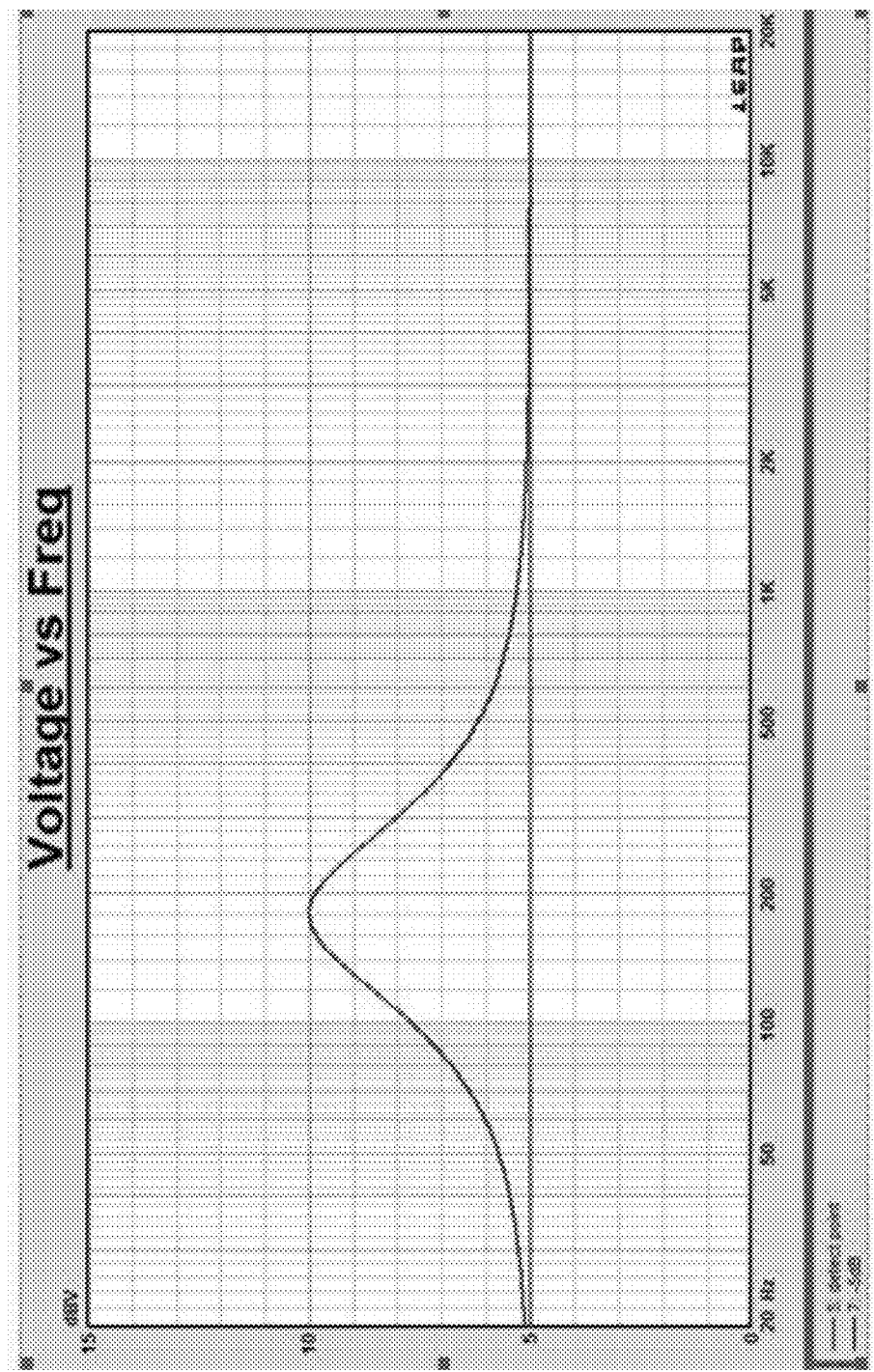
FIG. 2 is a working diagram of a compressor system with EQ in accordance with an embodiment of the utility model.

Now referring to FIG. 2, different electrical levels threshold of full-band audio signal whose range is 20 Hz to 20 kHz, for example, are setup in the compressor 3. In at least one non-limiting embodiment, the electrical level threshold of 180 Hz is setup as 5 dB, for example. The value of the electric level of input signal (b1), e.g., 0 dB is compared to the electrical level threshold, e.g., 5 dB. As the value of electric level of input signal (b1) e.g., 0 dB is less than the electrical level threshold, e.g., 5 dB, the compressor 3 isn't triggered (i.e., is deactivated) and thus does not compress and does not limit the input signal (a). Accordingly, input signal (a) is maintained as the output to the signal output device in the form of output signal (a).

A tuner may also be provided that enhances both of the electrical level of input signal (a) and input signal (b) from 5 dB to 10 dB in the frequency of 180 Hz. Input signal (b) is attenuated (−5 dB) by the equalizer 2, then is input to the compressor 3 in the form of input signal (b1) (5 dB). In the compressor 3, the electrical level threshold of 180 Hz is still 5 dB. The value of electric level of input signal (b1), e.g., 5 dB, is equal to the electrical level threshold, e.g., 5 dB. Accordingly, the compressor (3) is triggered (i.e., activated) to compress and limit the input signal (a). The processed input signal (a) is then output to the signal output device 4 in the form of output signal (a1).

To further describe the signal output device 4, it includes, for example, at least one of the sound-box, loudspeaker or headset. After processed by the compressor system, the audio signal is received by the signal output device 4 with the characteristic of high fidelity and controllability. On account of the features, it meets the requirement of audio signal adjustment and achieves a wide range of application in audio signal processing.

For ease of illustration, electric level threshold of full-band audio signal is setup as a constant value in the compressor normally. When every frequency point's volume is greater than the electric level threshold, the curve of the output signal is close to a straight line without the trigger processing by the compressor. It doesn't achieve the efficacy of audio signal's adjustment.

The present utility model is disclosed according to preferred non-limiting embodiment in the aforementioned description; however, it is contemplated for one skilled at the art that the embodiments are applied only for an illustration of the present utility model rather than are interpreted as a limitation for the scope of the present utility model. It should be noted that the various substantial alternation or replacement equivalent to these embodiments shall be considered as being covered within the scope of the present utility model. Therefore, the protection scope of the present utility model shall be defined by the claims.

What is claimed is:

1. A compressor system with an equalizer (EQ), the compressor system comprising:
    a signal input device;
    an equalizer in signal communication with the signal input device to receive a first input signal, and to generate an equalized signal based on the input signal;
    a compressor in signal communication with the signal input device to receive a second input signal, the compressor including a signal detection module in signal communication with the equalizer; and
    a signal output device in signal communication with the compressor to receive one of a first output signal or a second output signal, wherein the compressor includes a signal detection module to perform audio signal processing of the compressor system with EQ based on operations comprising:
    outputting, via the signal input device, the first input signal and the second input signal to the compressor in parallel and at the same time, the second input signal being identical to the first input signal, and the second input signal is input to the compressor directly, while the first input signal is regulated by the equalizer to generate the equalized signal;
    outputting, via the equalizer, the equalized signal to the compressor, and detecting the equalized signal via the signal detection module, wherein an electrical level threshold of a full-band audio signal is setup in the compressor; and
    comparing a value of an electrical level of the equalized signal detected by the signal detection module to the electrical level threshold of corresponding frequency, in response to the value of electrical level of the equalized signal being greater than or equal to the electrical level threshold,
    wherein the compressor is triggered to compress and limit the second input signal, and in response to being triggered processes the second input signal to generate the output signal and outputs the output signal to the signal output device, and
    wherein, in response to the value of electrical level of the input signal being less than electrical level threshold, the compressor is not triggered to process the second input signal, generates a second output signal based on the second input signal, and outputs the second output signal to the signal output device.

2. The compressor system with EQ as claimed in claim 1, wherein the range of the full-band audio signal is from 20 Hz to 20 kHz.

3. The compressor system with EQ as claimed in claim 1, wherein the signal input device at least includes one of a mobile phone, a compact disc (CD) player, a digital video disc (DVD) player, a recorder, or a mobile media device.

4. The compressor system with EQ as claimed in claim 1, wherein the signal output device includes at least one of a sound-box, a loudspeaker or a headset.

\* \* \* \* \*